US012780722B2

(12) United States Patent

Hwang et al.

(10) Patent No.: US 12,780,722 B2

(45) Date of Patent: Nov. 3, 2026

(54) METHOD OF MANUFACTURING DISPLAY DEVICE

(71) Applicant: Samsung Display Co., LTD., Yongin-si (KR)

(72) Inventors: Soukjune Hwang, Yongin-si (KR); Dongjo Kim, Yongin-si (KR); Hyun Kim, Yongin-si (KR); Seonggeun Won, Yongin-si (KR); Jewon Yoo, Yongin-si (KR); Seungmin Lee, Yongin-si (KR); Danbi Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 123 days.

(21) Appl. No.: 18/443,043

(22) Filed: Feb. 15, 2024

(65) Prior Publication Data

US 2024/0360031 A1 Oct. 31, 2024

(30) Foreign Application Priority Data

Apr. 25, 2023 (KR) ........................ 10-2023-0054253

(51) Int. Cl.

*C03C 15/00* (2006.01)
*B24C 1/04* (2006.01)

(Continued)

(52) U.S. Cl.

CPC ................ *C03C 15/00* (2013.01); *B24C 1/04* (2013.01); *C03C 23/002* (2013.01); *H10H 20/01* (2025.01);

(Continued)

(58) Field of Classification Search

CPC .................................. B24C 1/04; C03C 15/00
See application file for complete search history.

(56) References Cited

U.S. PATENT DOCUMENTS

| | | | | |
|---|---|---|---|---|
| 6,045,715 A * | 4/2000 | Spierings | C03C 19/00 216/52 |
| 2015/0225283 A1* | 8/2015 | Huang | B24B 1/00 428/141 |

(Continued)

FOREIGN PATENT DOCUMENTS

| | | | |
|---|---|---|---|
| EP | 4291006 A2 | 12/2023 |
| JP | 2017111987 A * | 6/2017 |

(Continued)

OTHER PUBLICATIONS

JP-2017111987-A (Tamura) Jun. 22, 2017 (English language translation). [online] [retrieved Jan. 5, 2025]. Retrieved from: Espacenet. (Year: 2017).*

(Continued)

*Primary Examiner* — Erin Snelting

(74) *Attorney, Agent, or Firm* — Womble Bond Dickinson (US) LLP

(57) ABSTRACT

In a method of manufacturing a display device, the method includes: forming a patterning film on a back surface of a glass; patterning the patterning film to expose a bending area of the glass; forming a groove overlapping the bending area on a back surface of the glass by providing abrasive particles to the exposed glass; forming an acid-resistant film on a front surface of the glass; and etching the glass.

12 Claims, 17 Drawing Sheets

(51) Int. Cl.
*C03C 23/00* (2006.01)
*H10H 20/01* (2025.01)

(52) U.S. Cl.
CPC ... *C03C 2218/355* (2013.01); *H10H 20/0362* (2025.01)

(56) References Cited

U.S. PATENT DOCUMENTS

| | | | | |
|---|---|---|---|---|
| 2020/0328382 | A1* | 10/2020 | Lee | G02B 6/0051 |
| 2021/0191467 | A1* | 6/2021 | Sunwoo | B32B 27/38 |
| 2023/0371346 | A1 | 11/2023 | Yun et al. | |

FOREIGN PATENT DOCUMENTS

| | | | |
|---|---|---|---|
| KR | 10-2014-0058725 | A | 5/2014 |
| KR | 10-2020-0080752 | A | 7/2020 |
| KR | 10-2369002 | B1 | 3/2022 |

OTHER PUBLICATIONS

KR 10-2014-0058725 A (Park) May 15, 2014 (English language translation). [online] [retrieved Jan. 5, 2025]. Retrieved from: Clarivate Analytics (Year: 2014).*

EPO Extended European Search Report dated Oct. 16, 2024, issued in corresponding European Patent Application No. 24166599.1 (15 pages).

* cited by examiner

METHOD OF MANUFACTURING DISPLAY DEVICE

CROSS-REFERENCE TO RELATED APPLICATION

The present application claims priority to and the benefit of Korean Patent Application No. 10-2023-0054253, filed on Apr. 25, 2023, in the Korean Intellectual Property Office, the entire disclosure of which is incorporated herein by reference.

BACKGROUND

1. Field

Aspects of some embodiments of the present disclosure relate generally to a method of manufacturing a display device.

2. Description of the Related Art

A display device generally includes a display panel and at least one driver for driving the display panel, and an area in which the driver is located becomes a non-display area at which images are not displayed. Recently, display devices having a bent structure have been developed to reduce an area of the non-display area. In a display device having a bent structure, components such as a substrate may be broken in the bending area, which reduces the yield of the display device.

The above information disclosed in this Background section is only for enhancement of understanding of the background and therefore the information discussed in this Background section does not necessarily constitute prior art.

SUMMARY

Aspects of some embodiments of the present disclosure relate generally to a method of manufacturing a display device. For example, aspects of some embodiments of the present disclosure relate to a method of manufacturing a display device having a bending area.

A method of manufacturing a display device according to some embodiments includes: forming a patterning film on a back surface of a glass, patterning the patterning film to expose a bending area of the glass, forming a groove overlapping the bending area on a back surface of the glass by providing abrasive particles to the exposed glass, forming an acid-resistant film on a front surface of the glass, and etching the glass.

According to some embodiments, the groove may be formed by a blast process using the abrasive particles.

According to some embodiments, the abrasive particles may be chemically stable particles from the glass.

According to some embodiments, each of the abrasive particles may be alumina oxide ($Al_2O_3$).

According to some embodiments, an average diameter of each of the abrasive particles may be about 3 μm to about 4 μm.

According to some embodiments, the patterning film may be a dry film resist (DFR).

According to some embodiments, a thickness of the dry film resist is about 40 μm to about 50 μm.

According to some embodiments, the method may further include removing the patterning film, after forming the groove.

According to some embodiments, the glass may be wet etched by hydrofluoric acid solution.

According to some embodiments, the method may further include removing the acid-resistant film, after etching the glass.

According to some embodiments, the method may further include forming a substrate on the front surface of the glass, forming a transistor layer on the substrate, forming a light emitting diode layer on the transistor layer, and forming an encapsulation layer on the light emitting diode layer.

According to some embodiments, forming the groove may be performed in a first chamber, and etching the glass may be performed in a second chamber different from the first chamber.

A method of manufacturing a display device some embodiments includes: forming a groove overlapping a bending area by irradiating a laser to a back surface of a glass, forming an acid-resistant film on a front surface of the glass, and etching the glass.

According to some embodiments, the glass may be wet etched by hydrofluoric acid solution.

According to some embodiments, the method may further include removing the acid-resistant film, after etching the glass.

According to some embodiments, the method may further include forming a laser protection layer on the front surface of the glass, forming a substrate on the laser protection layer, forming a transistor layer on the substrate, forming a light emitting diode layer on the transistor layer, and forming an encapsulation layer on the light emitting diode layer, before irradiating the laser.

Therefore, in the method of manufacturing a display device according to some embodiments of the present invention, a transistor layer, a light emitting diode layer, and an encapsulation layer may be formed on glass, a groove may be formed in a bending area of the glass through a blast process, and a glass may be entirely etched through a wet etching process. The glass may serve as a support substrate while forming a transistor layer, a light emitting diode layer, and an encapsulation layer, and may relatively improve durability of a display device. In addition, as the grooves are formed through the blast process, chemical by-products may not be generated during groove formation. Accordingly, the etching distribution of the wet etching process may be relatively improved, and the taper angle of the glass may be formed to a target angle.

BRIEF DESCRIPTION OF THE DRAWINGS

The accompanying drawings, which are included to provide a further understanding of the inventive concept and are incorporated in and constitute a part of this specification, illustrate embodiments of the inventive concept together with the description.

DETAILED DESCRIPTION

Aspects of illustrative, non-limiting embodiments will be more-clearly understood from the following detailed description in conjunction with the accompanying drawings.

Figure 1:
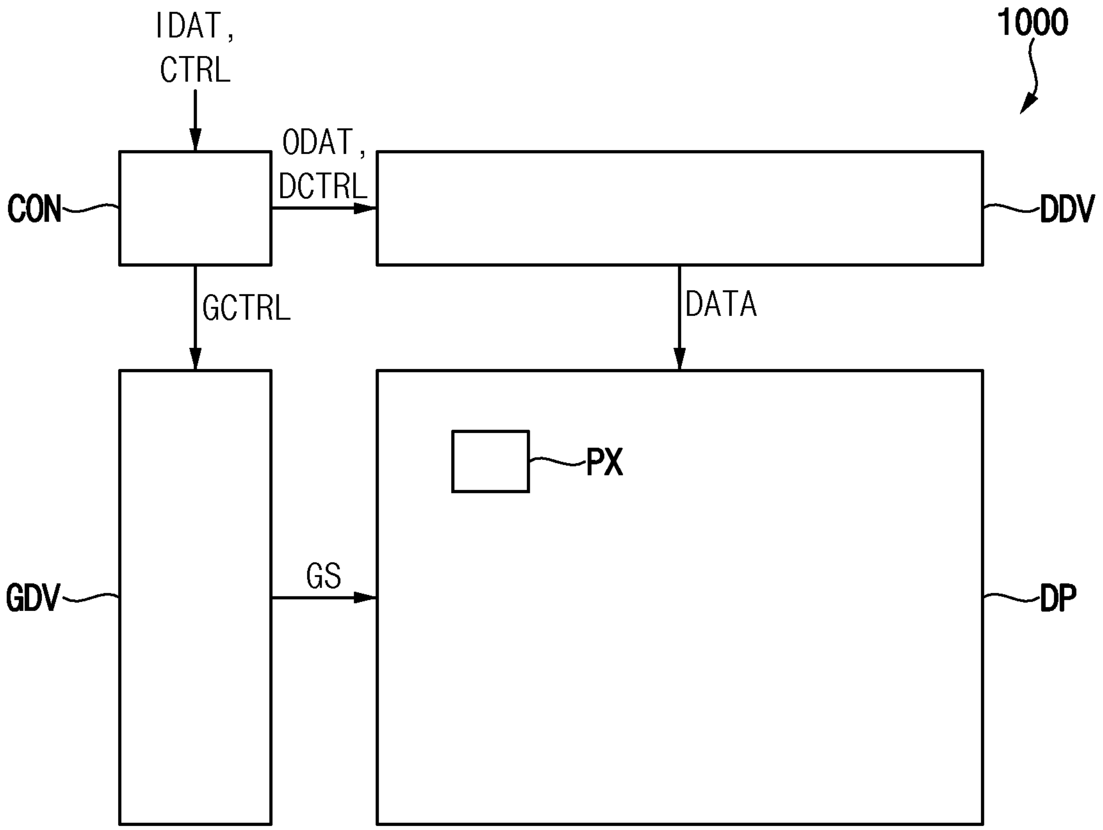
FIG. 1 is a block diagram illustrating a display device according to some embodiments of the present invention.

FIG. 1 is a block diagram illustrating a display device according to some embodiments of the present invention.

Referring to FIG. 1, a display device 1000 according to some embodiments of the present invention may include a display part (or display panel) DP, a data driver DDV, a gate driver GDV, and a controller CON.

The display part DP may include at least one pixel PX. The pixel PX may emit light, and the display part DP may display images. For example, the pixel PX may emit light corresponding to a data voltage DATA in response to a gate signal GS. Although FIG. 1 illustrates a single pixel PX, as a person having ordinary skill in the art would appreciate, the display part DP may include any suitable number of pixels PX according to the design and size of the display part DP.

The data driver DDV may generate the data voltage DATA based on an output image data ODAT and a data control signal DCTRL. For example, the data driver DDV may generate the data voltage DATA corresponding to the output image data ODAT and may output the data voltage DATA in response to the data control signal DCTRL. The data control signal DCTRL may include an output data enable signal, a horizontal start signal, and a load signal.

The gate driver GDV may generate the gate signal GS based on a gate control signal GCTRL. For example, the gate control signal GCTRL may include a vertical start signal and a clock signal. In response to the gate signal GS, the transistor of the pixel PX may be turned on or off, and the data voltage DATA may be written into the pixel PX.

The controller CON (e.g., a timing controller T-CON) may receive input image data IDAT and a control signal CTRL from an external host processor (e.g., GPU). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

Figure 2:
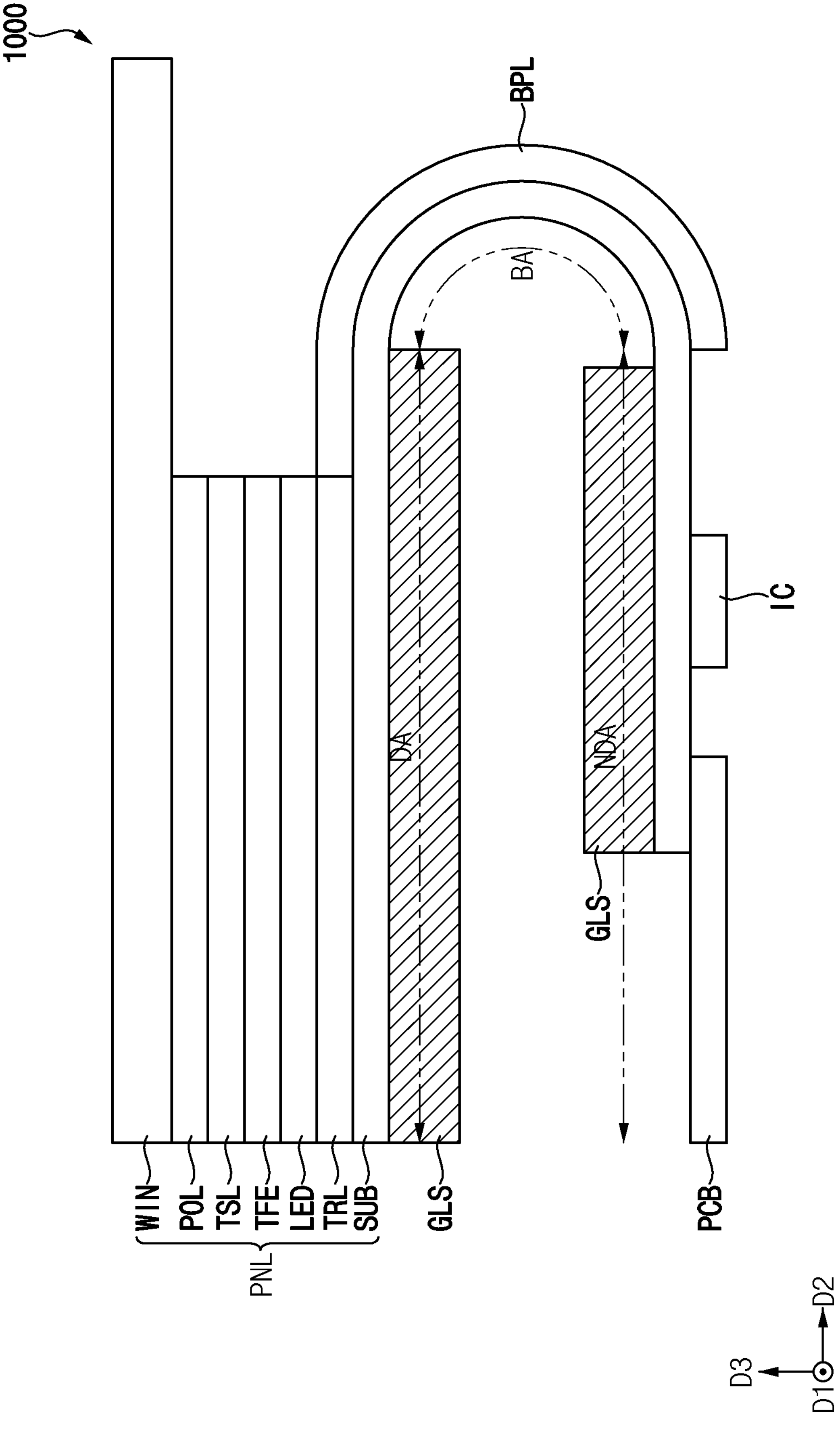
FIG. 2 is a cross-sectional view illustrating the display device of FIG. 1 according to some embodiments of the present invention.
Figure 3:
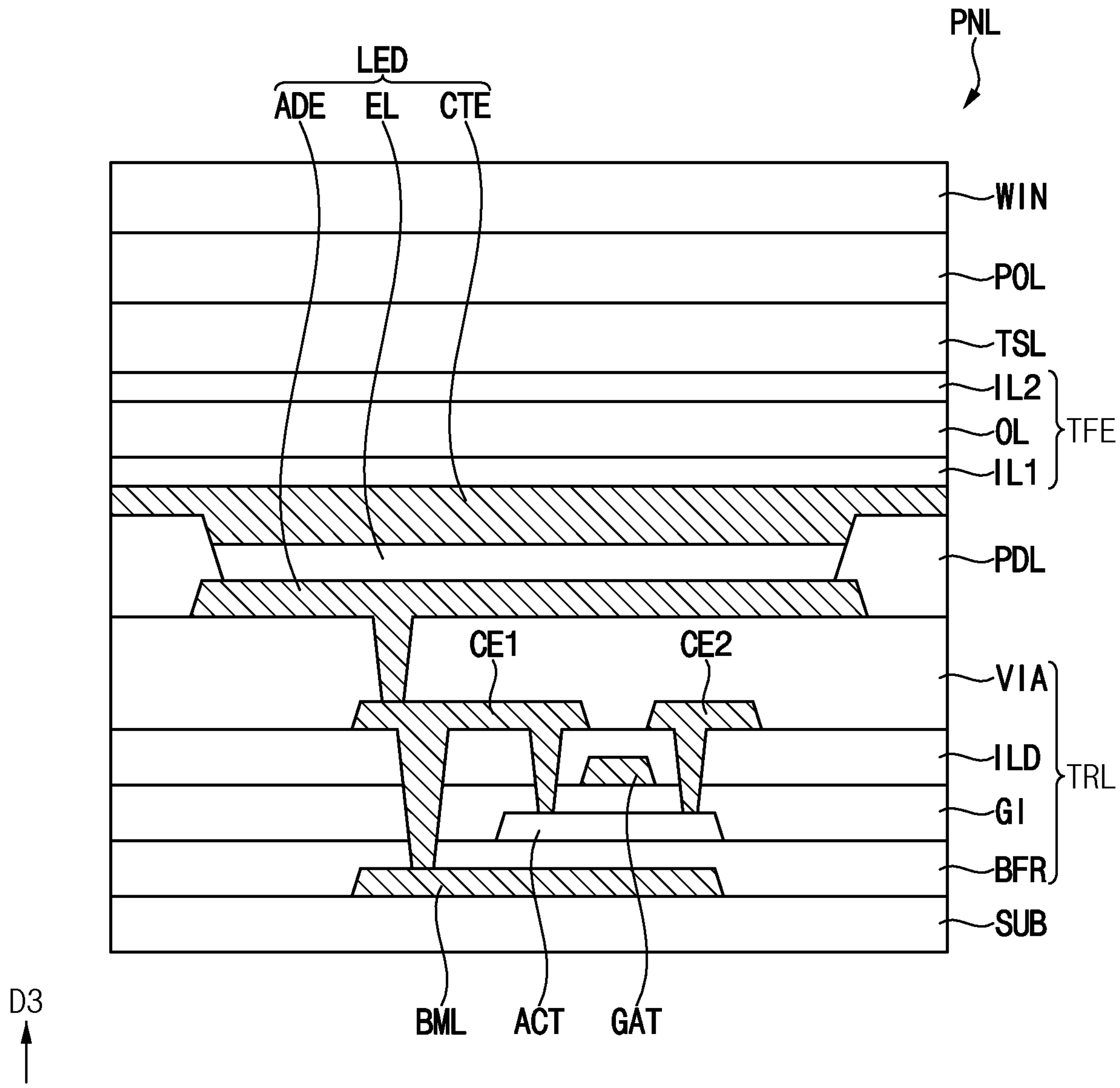
FIG. 3 is a cross-sectional view illustrating a display panel included in the display device of FIG. 2 according to some embodiments of the present invention.

FIG. 2 is a cross-sectional view illustrating the display device of FIG. 1. FIG. 3 is a cross-sectional view illustrating a display panel included in the display device of FIG. 2.

Referring to FIG. 2, the display device 1000 may include glass GLS, a display panel PNL, a bending protection layer BPL, an integrated circuit IC, and a printed circuit board PCB.

According to some embodiments, the display device 1000 may be divided into a display area DA, a bending area BA, and a non-display area NDA.

The display area DA may be an area parallel to a plane formed in a first direction D1 and a second direction D2 crossing the first direction D1. The display panel PNL may be located in the display area DA, and images may be displayed at the display area.

The bending area BA may be adjacent to the display area DA in the second direction D2 and may be bent from the display area DA (e.g., in a direction away from a window WIN). The non-display area NDA may be connected to the bending area BA and overlap the display area DA when the bending area BA is bent, and the integrated circuit IC and the printed circuit board PCB may be located in the non-display area NDA. As the display device 1000 is bent in the bending area BA, a dead space of the display device 1000 may be reduced. The non-display area NDA may be an area at which images are not displayed.

The glass GLS may support the display panel PNL. For example, the display panel PNL may be stacked from the glass GLS in a third direction D3 perpendicular to the first and second directions D1 and D2. According to some embodiments, a thickness of the glass GLS may be in a range of 200 μm to 300 μm. Examples of materials that can be used as the glass GLS may include ultra-thin tempered glass (UTG), glass, quartz, plastic, and the like. These may be used alone or in combination with each other. In addition, the glass GLS may be composed of a single layer or multiple layers in combination with each other.

According to some embodiments, the glass GLS may be removed from the bending area BA. Accordingly, the glass GLS may be prevented from being broken in the bending area BA, and the display device 1000 may be bent more smoothly without being damaged.

The bending protection layer BPL may be located in the bending area BA on the substrate SUB. The bending protection layer BPL may protect the display device 1000 from stress generated when the display device 1000 is bent. Examples of materials that can be used as the bending protection layer BPL may include acrylic-based resins and urethane-based resins. These may be used alone or in combination with each other.

The integrated circuit IC may be located in the non-display area NDA on the substrate SUB. The integrated circuit IC may correspond to the data driver DDV and may be electrically connected to the display panel PNL through the substrate SUB.

The printed circuit board PCB may be located in the non-display area NDA on the substrate SUB. The controller CON may be mounted on the printed circuit board PCB, and may be electrically connected to the integrated circuit IC and the display panel PNL through the substrate SUB.

Referring to FIG. 3, the display panel PNL may include the substrate SUB, a transistor layer TRL, a light emitting diode layer LED, an encapsulation layer TFE, a sensing layer TSL, a polarization layer POL, and a window WIN.

The transistor layer TRL may include a lower metal pattern BML, a buffer layer BFR, an active pattern ACT, a gate insulating layer GI, a gate electrode GAT, an interlayer insulating layer ILD, first and second connection electrodes CE1 and CE2, and a via layer VIA. The light emitting diode layer LED may include a pixel electrode ADE, a pixel defining layer PDL, an emission layer EL, and a common electrode CTE. The encapsulation layer TFE may include a first inorganic layer IL1, an organic layer OL, and a second inorganic layer IL2.

The substrate SUB may include an organic insulating material such as plastic such as polyimide (PI) or an inorganic insulating material such as organic. In addition, the substrate SUB may be composed of a single layer or multiple layers in combination with each other.

The lower metal pattern BML may be located on the substrate SUB. According to some embodiments, the lower metal pattern BML may be formed of a metal, an alloy, a conductive metal oxide, a transparent conductive material, or the like. Examples of materials that can be used as the lower metal pattern BML may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. In addition, the lower metal pattern BML may be formed as a single layer or as multiple layers in combination with each other.

The buffer layer BFR may be located on the substrate SUB and may cover the lower metal pattern BML. According to some embodiments, the buffer layer BFR may be formed of an inorganic insulating material. Examples of materials that can be used as the inorganic insulating material may include silicon oxide, silicon nitride, and silicon oxynitride. These may be used alone or in combination with each other. The buffer layer BFR may prevent diffusion of metal atoms or atoms or impurities from the substrate SUB into the active pattern ACT. In addition, the buffer layer BFR may control a heat supply rate during a crystallization process for forming the active pattern ACT.

The active pattern ACT may be located on the buffer layer BFR. According to some embodiments, the active pattern ACT may be formed of a silicon semiconductor material or an oxide semiconductor material. Examples of the silicon semiconductor material that can be used as the active pattern ACT may include amorphous silicon and polycrystalline silicon. Examples of the oxide semiconductor material that can be used as the active pattern ACT may include InGaZnO (IGZO) and InSnZnO (ITZO). In addition, the oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

The gate insulating layer GI may cover the active pattern ACT and may be located on the buffer layer BFR. According to some embodiments, the gate insulating layer GI may be formed of an insulating material. Examples of an insulating material that can be used as the gate insulating layer GI may include silicon oxide, silicon nitride, and silicon oxynitride. These may be used alone or in combination with each other.

The gate electrode GAT may be located on the gate insulating layer GI. According to some embodiments, the gate electrode GAT may be formed of metal, alloy, conductive metal oxide, transparent conductive material, or the like. Examples of materials that can be used for the gate electrode GAT may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The interlayer insulating layer ILD may be located on the buffer layer BFR. The interlayer insulating layer ILD may cover the gate electrode GAT. According to some embodiments, the interlayer insulating layer ILD may be formed of an insulating material. Examples of insulating materials that can be used as the interlayer insulating layer ILD may include silicon oxide, silicon nitride, and silicon oxynitride. These may be used alone or in combination with each other.

The first and second connection electrodes CE1 and CE2 may be located on the interlayer insulating layer ILD. According to some embodiments, the first and second connection electrodes CE1 and CE2 may be formed of metal, alloy, conductive metal oxide, transparent conductive material, or the like. Examples of materials that may be used as the first and second connection electrodes CE1 and CE2 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The first connection electrode CE1 may contact the lower metal pattern BML and the active pattern ACT, and the second connection electrode CE2 may contact the active pattern ACT.

The via layer VIA may cover the first and second connection electrodes CE1 and CE2 and may be located on the interlayer insulating layer ILD. According to some embodiments, the via layer VIA may be formed of an organic material. Examples of organic materials that can be used for the via layer VIA may include photoresist, polyacrylic resin, polyimide resin, and acrylic resin. These may be used alone or in combination with each other.

The pixel electrode ADE may be located on the via layer VIA. According to some embodiments, the pixel electrode ADE may be formed of metal, alloy, conductive metal oxide, transparent conductive material, or the like. Examples of materials that can be used as the pixel electrode ADE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The pixel defining layer PDL may be located on the pixel electrode ADE and may cover an end of the pixel electrode ADE. According to some embodiments, the pixel defining layer PDL may be formed of an organic material. Examples of organic materials that can be used as the pixel defining layer PDL may include photoresist, polyacrylic resin, polyimide resin, and acrylic resin. These may be used alone or in combination with each other.

The emission layer EL may be located on the pixel electrode ADE. The common electrode CTE may be located on the emission layer EL.

The first inorganic layer IL1 may be located on the common electrode CTE. According to some embodiments, the first inorganic layer IL1 may be formed of an inorganic material. Examples of inorganic materials that may be used as the first inorganic layer IL1 may include silicon oxide, silicon nitride, and silicon oxynitride. These may be used alone or in combination with each other.

The organic layer OL may be located on the first inorganic layer IL1. According to some embodiments, the organic layer OL may be formed of an organic material. Examples of organic materials that can be used as the organic layer OL may include photoresist, polyacrylic resin, polyimide resin, and acrylic resin. These may be used alone or in combination with each other.

The second inorganic layer IL2 may be located on the organic layer OL. According to some embodiments, the second inorganic layer IL2 may be formed of an inorganic material. Examples of inorganic materials that may be used as the second inorganic layer IL2 may include silicon oxide, silicon nitride, and silicon oxynitride. These may be used alone or in combination with each other.

The sensing layer TSL may be located on the second inorganic layer IL2. According to some embodiments, the sensing layer TSL may be a touch panel and may sense a user's touch. The polarization layer POL may be located on the sensing layer TSL. The polarization layer POL may polarize light and increase light efficiency of the emission layer EL. The window WIN may be located on the polarization layer POL.

Figure 4:
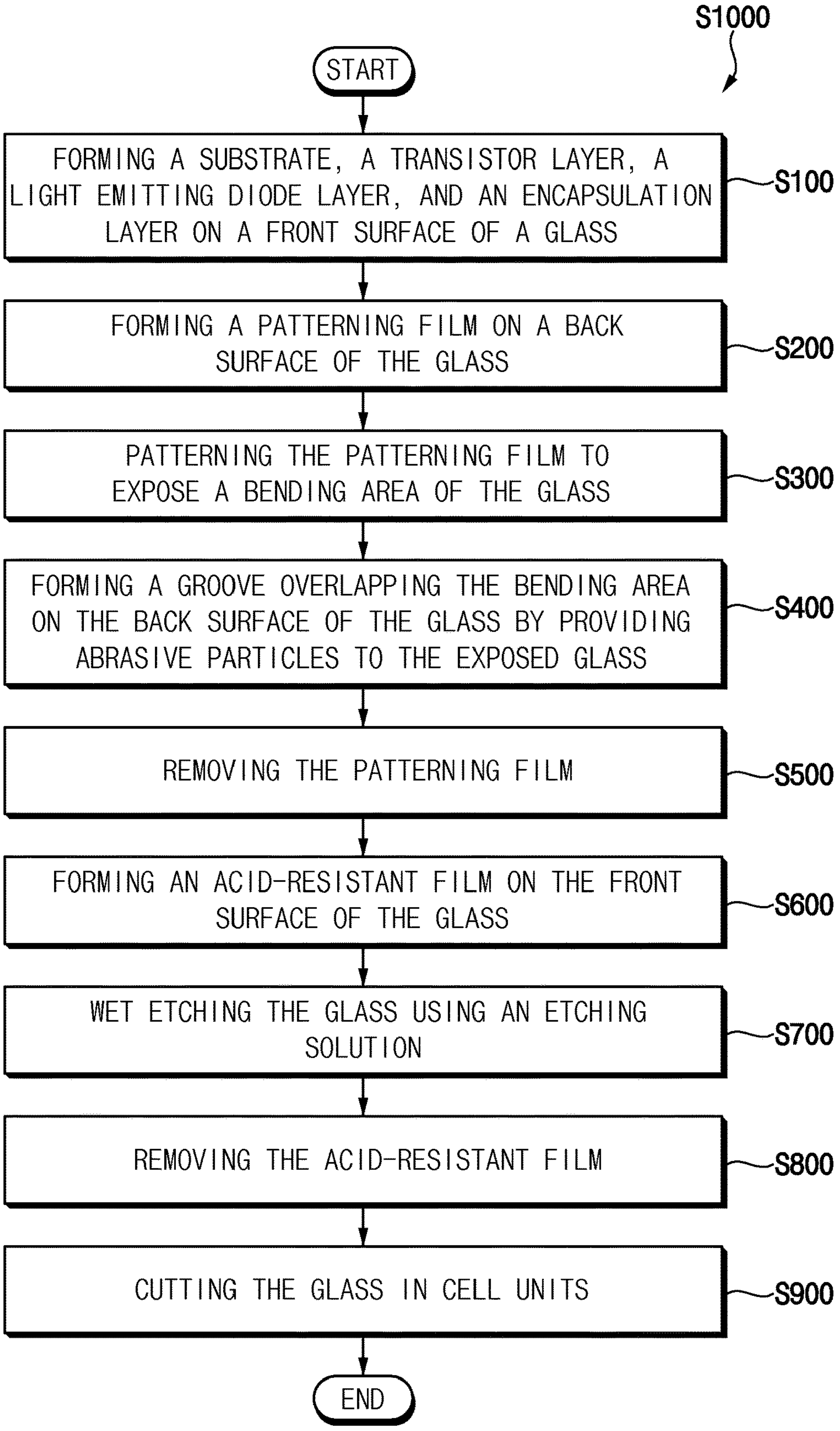
FIG. 4 is a flowchart illustrating a method of manufacturing a display device according to some embodiments of the present invention.

FIG. 4 is a flowchart illustrating a method of manufacturing a display device according to some embodiments of the present invention. Embodiments according to the present disclosure are not limited to the number and order of operations illustrated in FIG. 4, unless otherwise stated or implied. For example, some embodiments may include additional operations or fewer operations, and the operations may be executed in a different order without departing from the spirit and scope of embodiments according to the present disclosure. FIGS. 5 to 15 are diagrams illustrating the method of FIG. 4.

Figure 5:
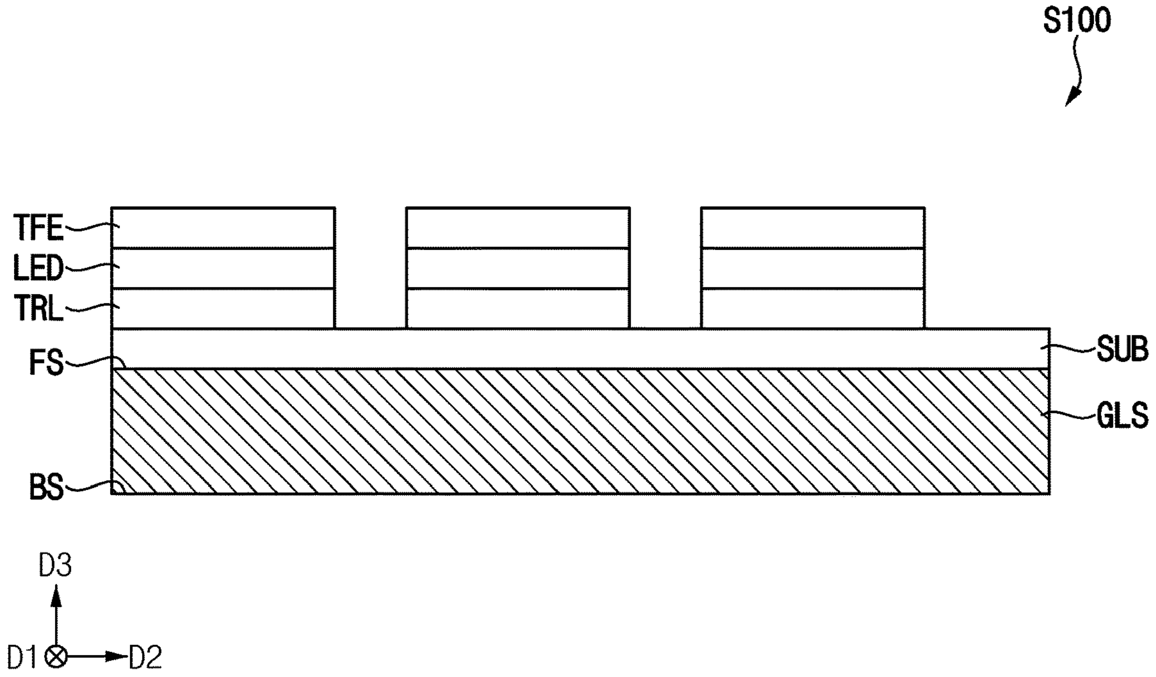
FIGS. 5 to 15 are diagrams illustrating the method of FIG. 4 according to some embodiments of the present invention.

Referring to FIGS. 4 and 5, in a method (S1000) of manufacturing of the display device according to some embodiments of the present invention, the substrate SUB, the transistor layer TRL, the light emitting diode layer LED, and the encapsulation layer TFE may be sequentially formed on a front surface FS of the glass GLS (S100).

Figure 6:
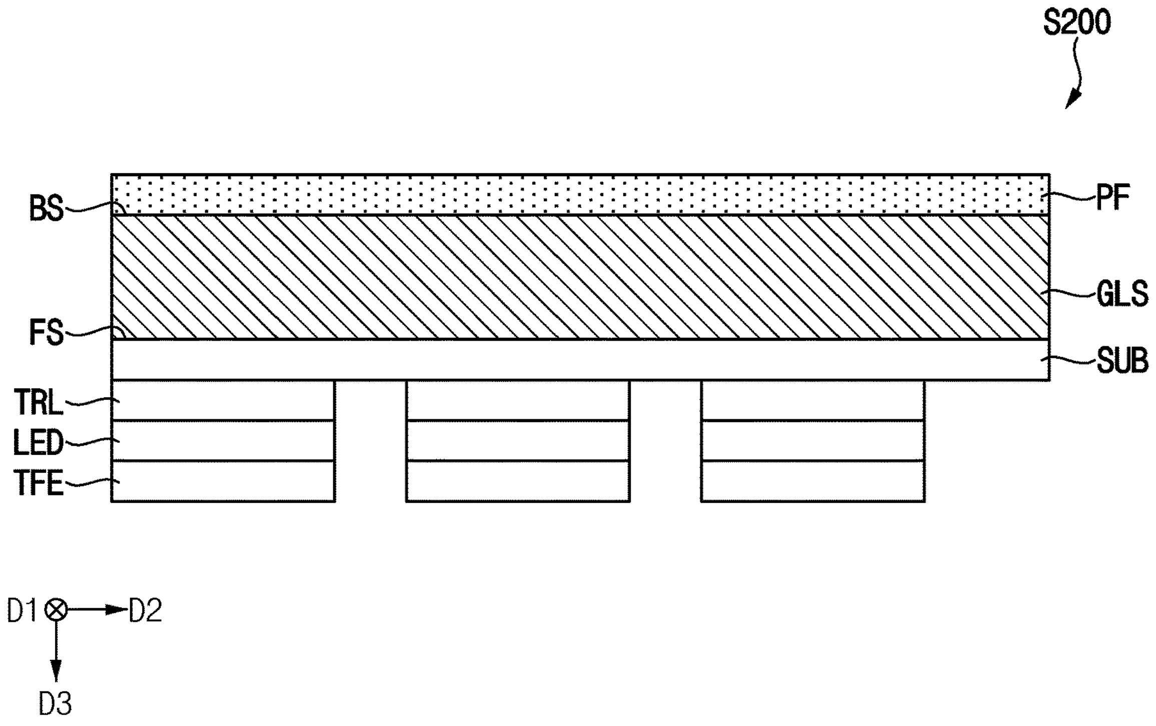

Referring to FIGS. 4 and 6, a patterning film PF may be formed on a back surface BS of the glass GLS. According to some embodiments, the patterning film PF may be a dry film resist (DFR), and a thickness of the dry film resist may be about 40 μm to about 50 μm.

Figure 7:
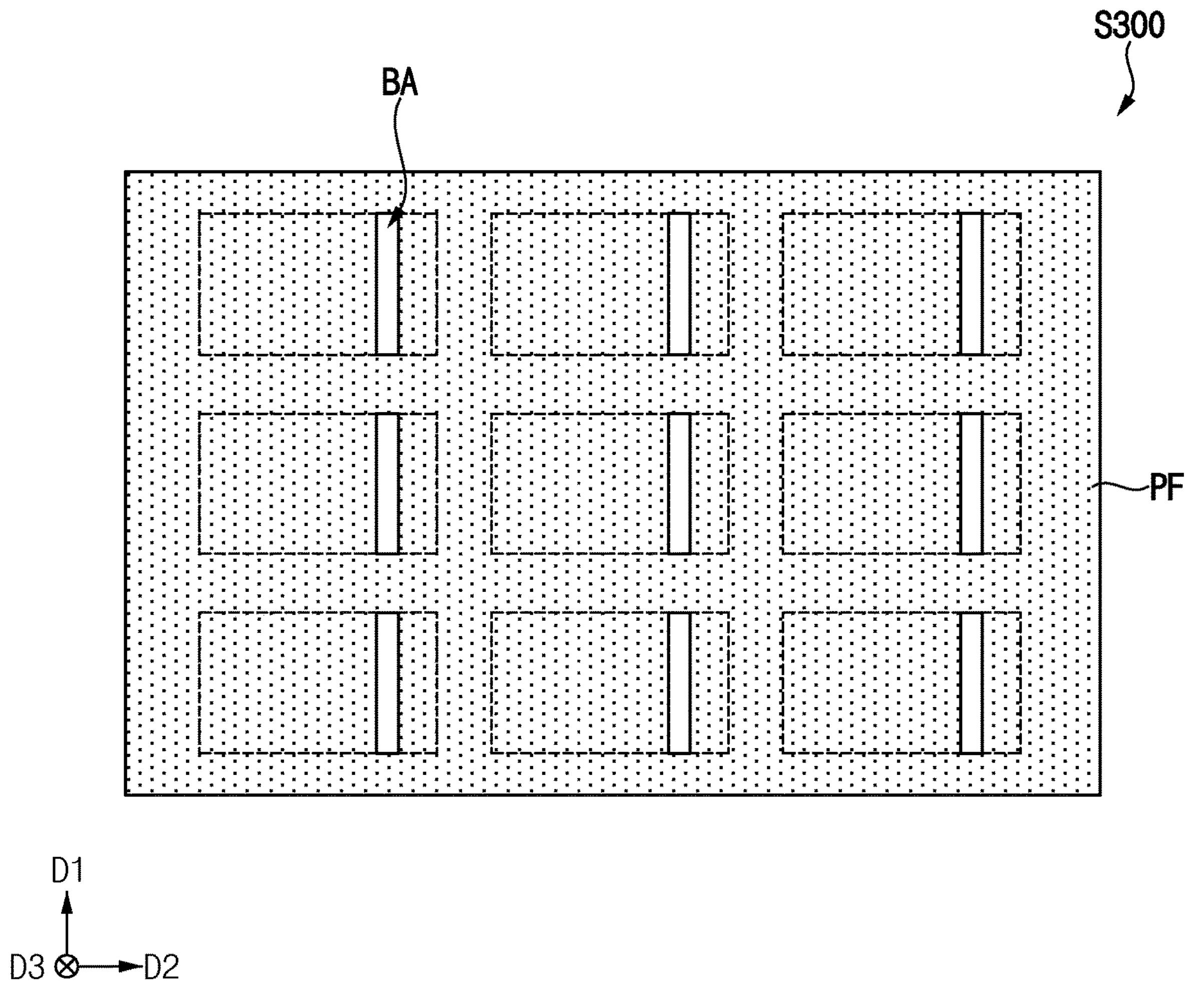
Figure 8:
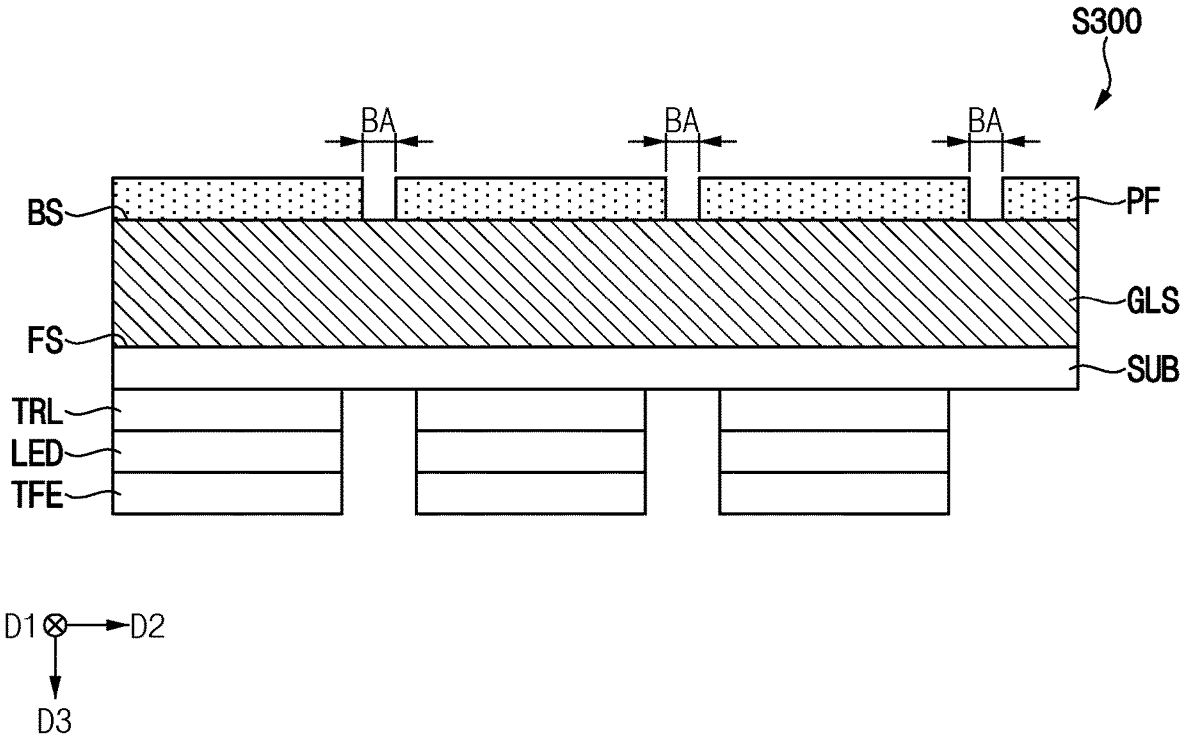

Referring to FIGS. 4, 7, and 8, the bending area BA of the glass GLS may be exposed by patterning the patterning film PF (S300). In other words, the back surface BS corresponding to the bending area BA of the glass GLS may be exposed through the pattern of the patterning film PF.

Figure 9:
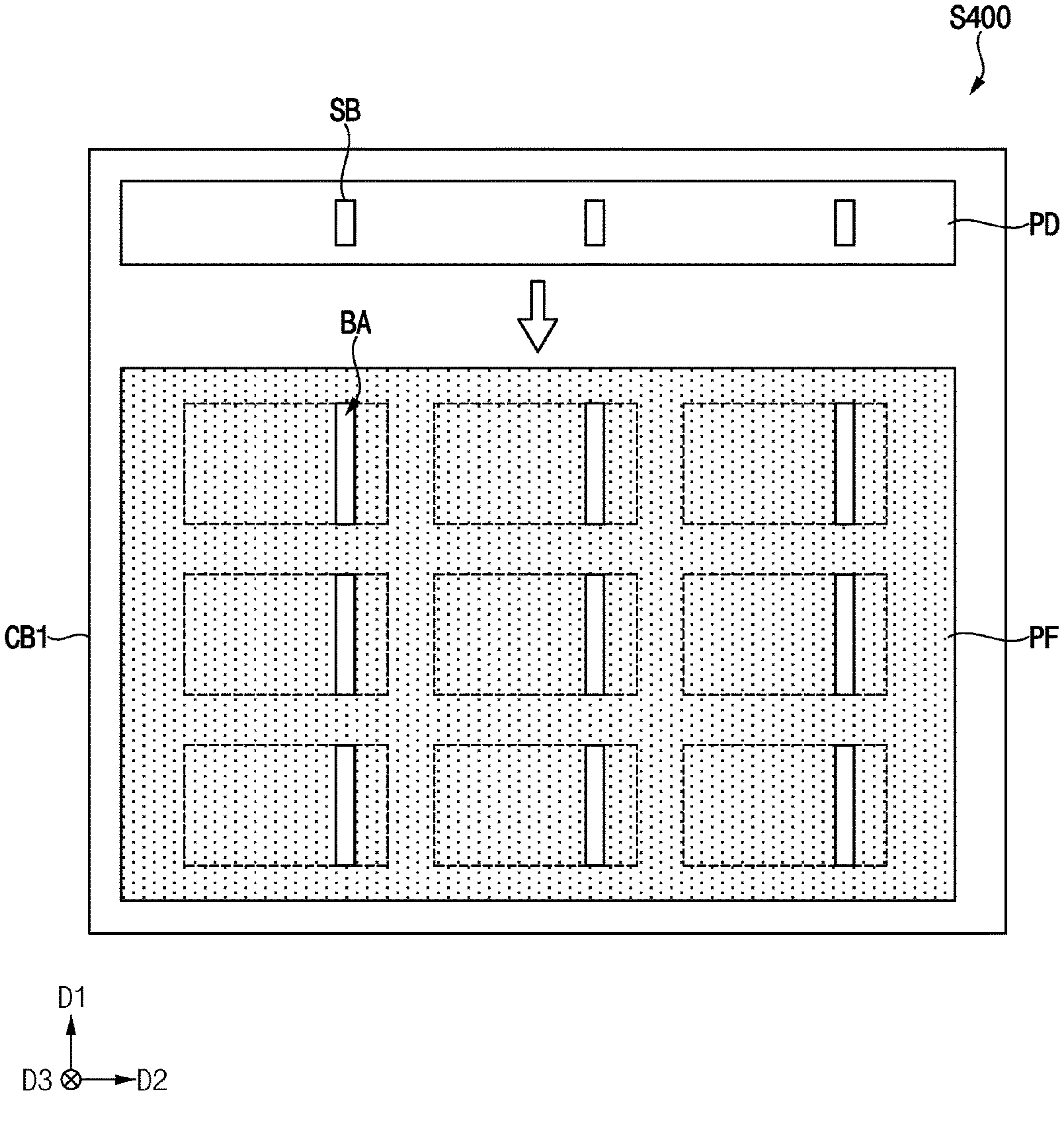
Figure 10:
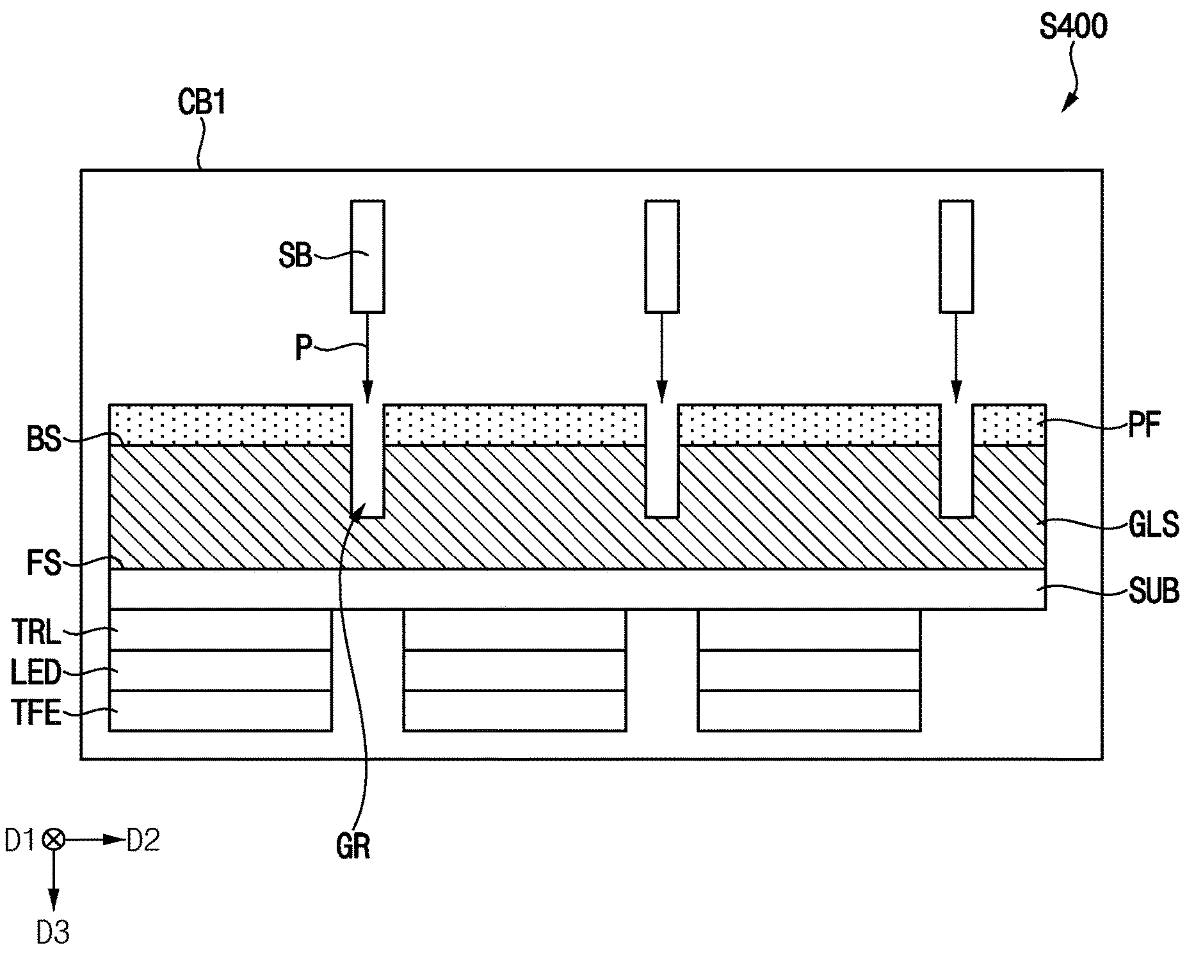

Referring to FIGS. 4, 9, and 10, abrasive particles P may be provided to the exposed glass GLS, and a groove GR overlap the bending area BA may be formed on the back surface BS of the glass GLS (S400). For example, a depth of the groove GR may be about 230 μm to about 280 μm.

According to some embodiments, the groove GR may be formed by a blast process using the abrasive particles P. The blast process may include a sand blast process, a micro blast process, and the like.

The abrasive particles P may be chemically stable particles from the glass GLS. In other words, the abrasive particles P may not chemically react with the glass GLS. For example, materials that can be used as the abrasive particles P may include alumina oxide ($Al_2O_3$), glass beads, or silicon carbide (SiC), etc. An average diameter of the abrasive particles P may be about 3 μm to about 4 μm.

According to some embodiments, the abrasive particles P may be provided from a polishing device PD including a spraying part SB. For example, the spraying part SB may be a blaster. After the polishing device PD is aligned so that the spraying part SB corresponds to the bending area BA, a blasting process may be performed while the polishing device PD moves upward on the patterning film PF.

Figure 11:
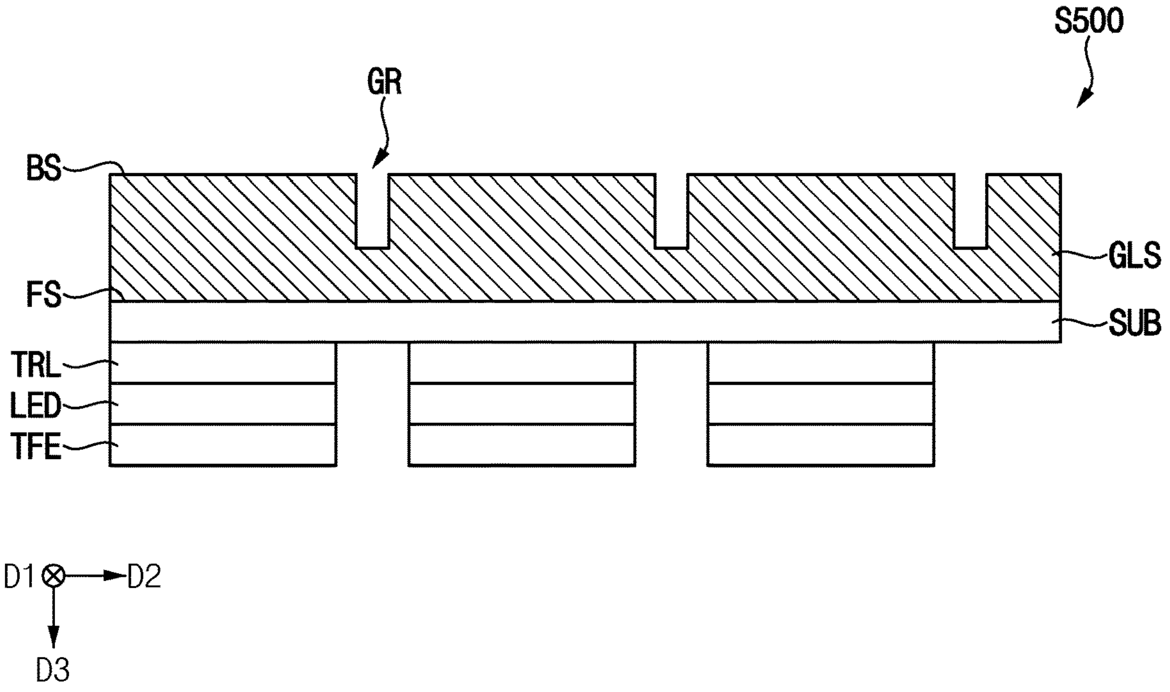

Referring to FIGS. 4 and 11, the patterning film PF may be removed (S500).

Figure 12:
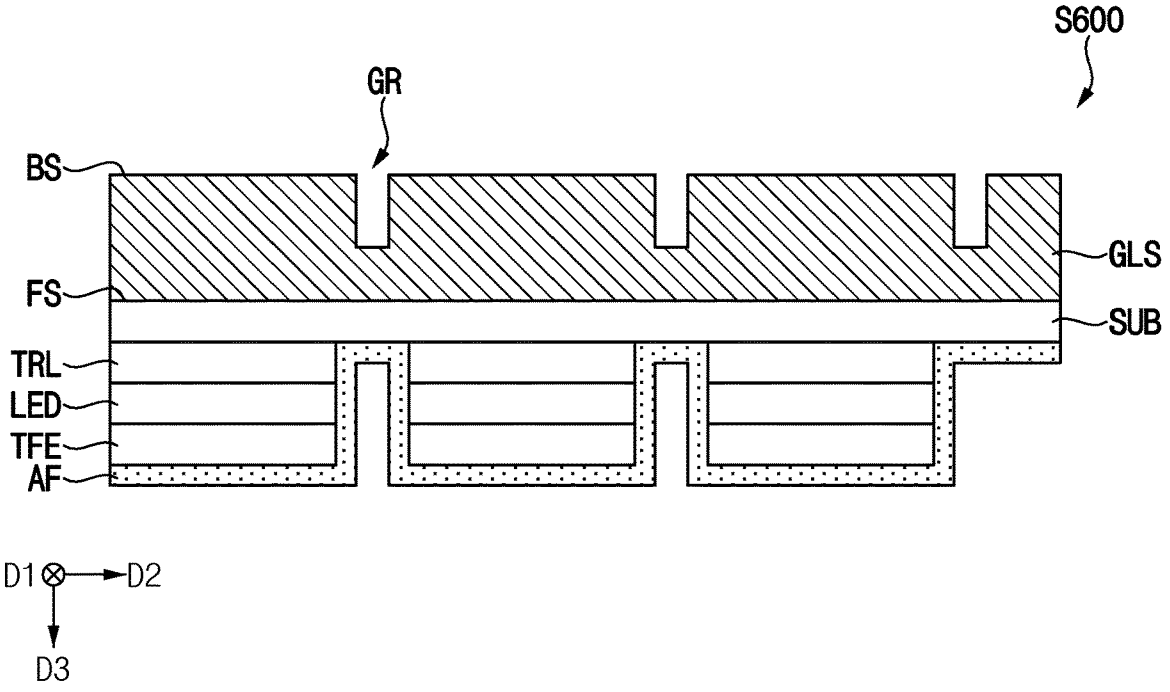

Referring to FIGS. 4 and 12, an acid-resistant film AF may be formed on the front surface FS of the glass GLS (S600). According to some embodiments, the acid-resistant film AF may be attached while covering the substrate SUB and the encapsulation layer TFE. In addition, a separate protective film may be further attached between the encapsulation layer TFE and the acid-resistant film AF. The acid-resistant film AF may protect the substrate SUB, the transistor layer TRL, the light emitting diode layer LED, and the encapsulation layer TFE from an etching solution (e.g., hydrofluoric acid solution).

Figure 13:
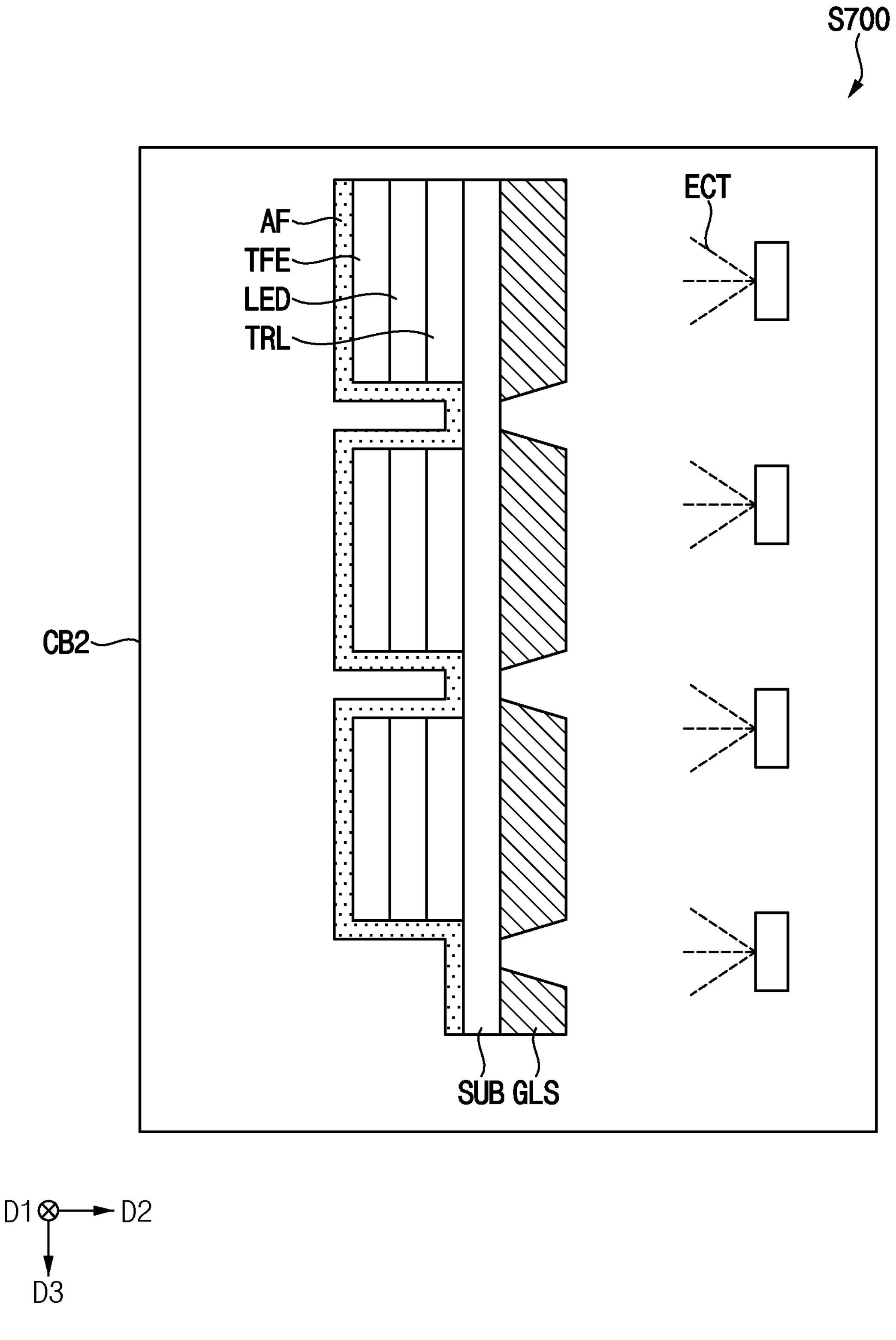

Referring to FIGS. 4 and 13, the glass GLS may be wet etched using an etching solution ECT (S700). According to some embodiments, the etching solution ECT may be a hydrofluoric acid solution, and the glass GLS may be isotropically etched by the hydrofluoric acid solution. Accordingly, an overall thickness of the glass GLS may be reduced, and the glass GLS overlapping the bending area BA where the groove GR is formed may be completely removed.

According to some embodiments, as shown in FIG. 13, the wet etching process may be performed by rotating the glass GLS at 90 degrees, but embodiments according to the present disclosure are not limited thereto.

According to some embodiments, as shown in FIGS. 9 and 10, the forming of the groove GR may be performed in a first chamber CB1. In addition, as shown in FIG. 13, the etching of the glass GLS may be performed in a second chamber CB2. In this case, the first chamber CB1 and the second chamber CB2 may be different from each other. Accordingly, while the glass GLS is being etched in the second chamber CB2, foreign substances generated in the blasting process performed in the first chamber CB1 may be blocked from the surface of the glass GLS.

Figure 14:
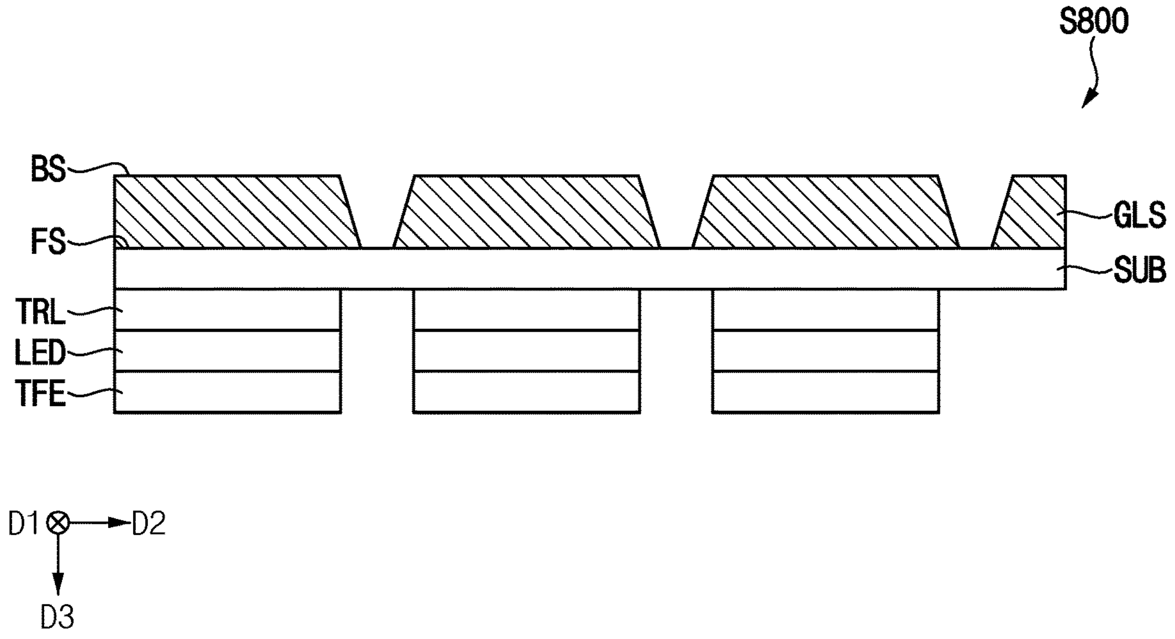

Referring to FIGS. 4 and 14, after the wet etching process is performed, the acid-resistant film AF may be removed (S800).

Figure 15:
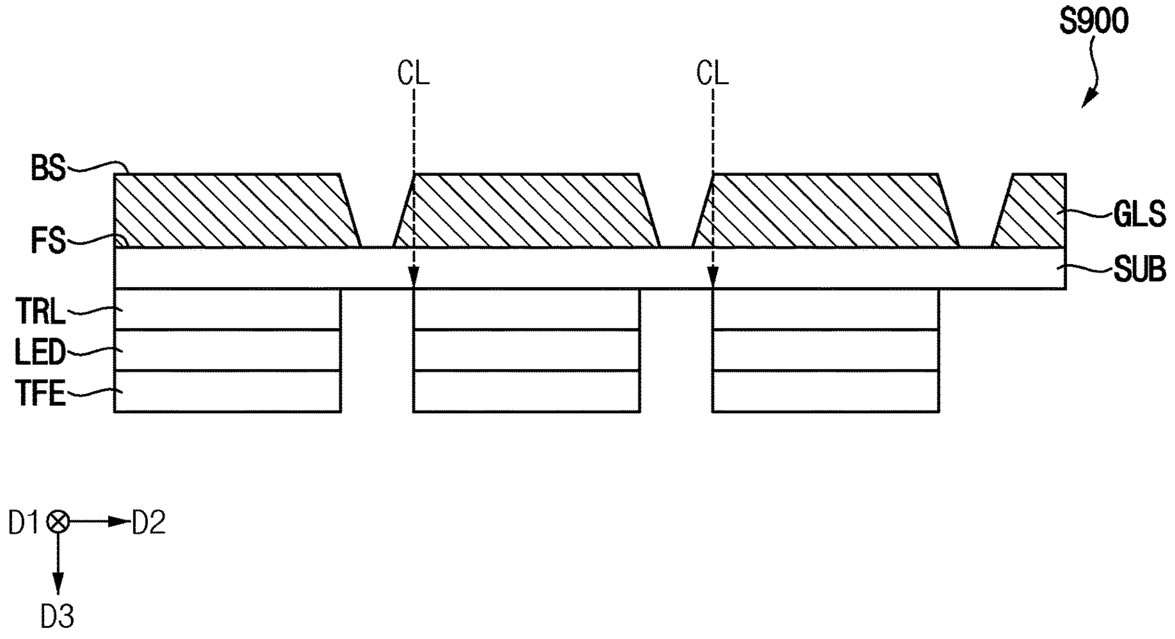

Referring to FIGS. 4 and 15, the glass GLS may be cut in cell units along a cutting line CL (S900).

In the method (S1000) of manufacturing a display device according to some embodiments of the present invention, the transistor layer TRL, the light emitting diode layer LED, and the encapsulation layer TFE may be formed on the glass GLS, the groove GR may be formed in the glass GLS through the blast process, and the glass GLS may be etched through a wet etching process. The glass GLS may serve as a support substrate while forming the transistor layer TRL, the light emitting diode layer LED, and the encapsulation layer TFE, and may relatively improve durability of the display device 1000. In addition, as the grooves GR are formed through the blasting process, chemical by-products may not be generated during the formation of the grooves GR. Accordingly, the etching distribution of the wet etching process may be relatively improved, and the taper angle of the glass GLS may be formed to a target angle.

Figure 16:
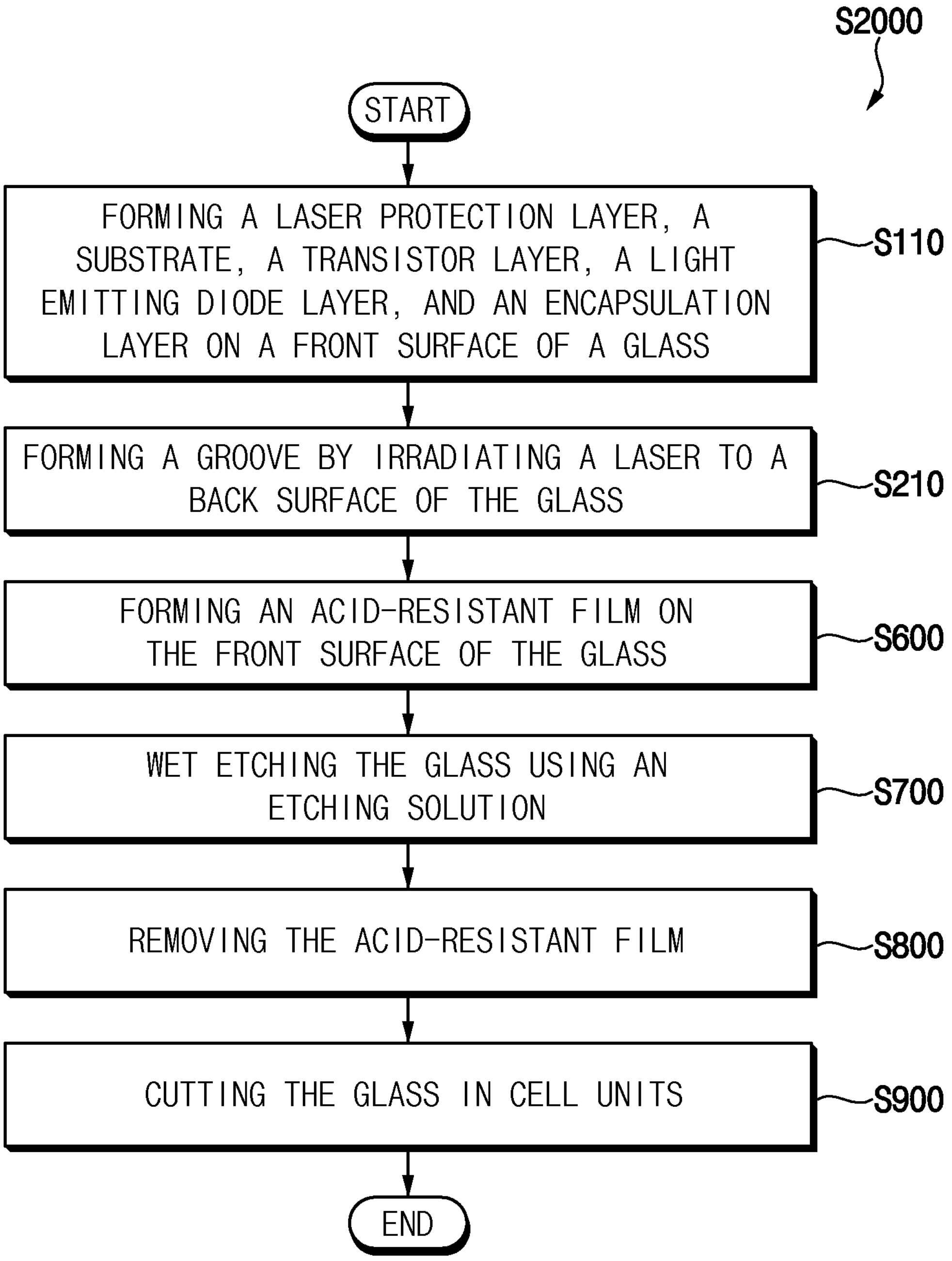
FIG. 16 is a flowchart illustrating a method of manufacturing a display device according to some embodiments of the present invention.

FIG. 16 is a flowchart illustrating a method of manufacturing a display device according to some embodiments of the present invention. Embodiments according to the present disclosure are not limited to the number and order of operations illustrated in FIG. 16, unless otherwise stated or implied. For example, some embodiments may include additional operations or fewer operations, and the operations may be executed in a different order without departing from the spirit and scope of embodiments according to the present disclosure. FIGS. 17 to 22 are diagrams illustrating the method of FIG. 16.

Figure 17:
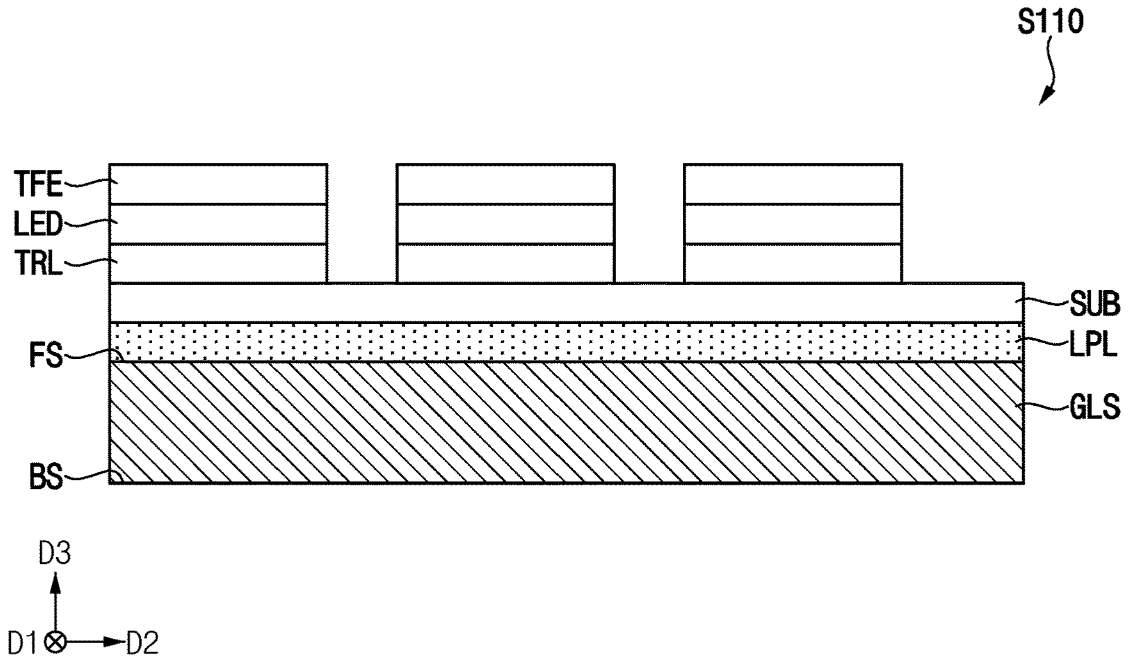
FIGS. 17 to 22 are diagrams illustrating the method of FIG. 16 according to some embodiments of the present invention.

Referring to FIGS. 16 and 17, in the method (S2000) of manufacturing a display device according to some embodiments of the present invention, a laser protection layer LPL, the substrate SUB, the transistor layer TRL, the light emitting diode layer LED, and the encapsulation layer TFE may be sequentially formed (S110). The laser protection layer LPL may be located between the glass GLS and the substrate SUB, and may protect the substrate SUB from a laser.

Figure 18:
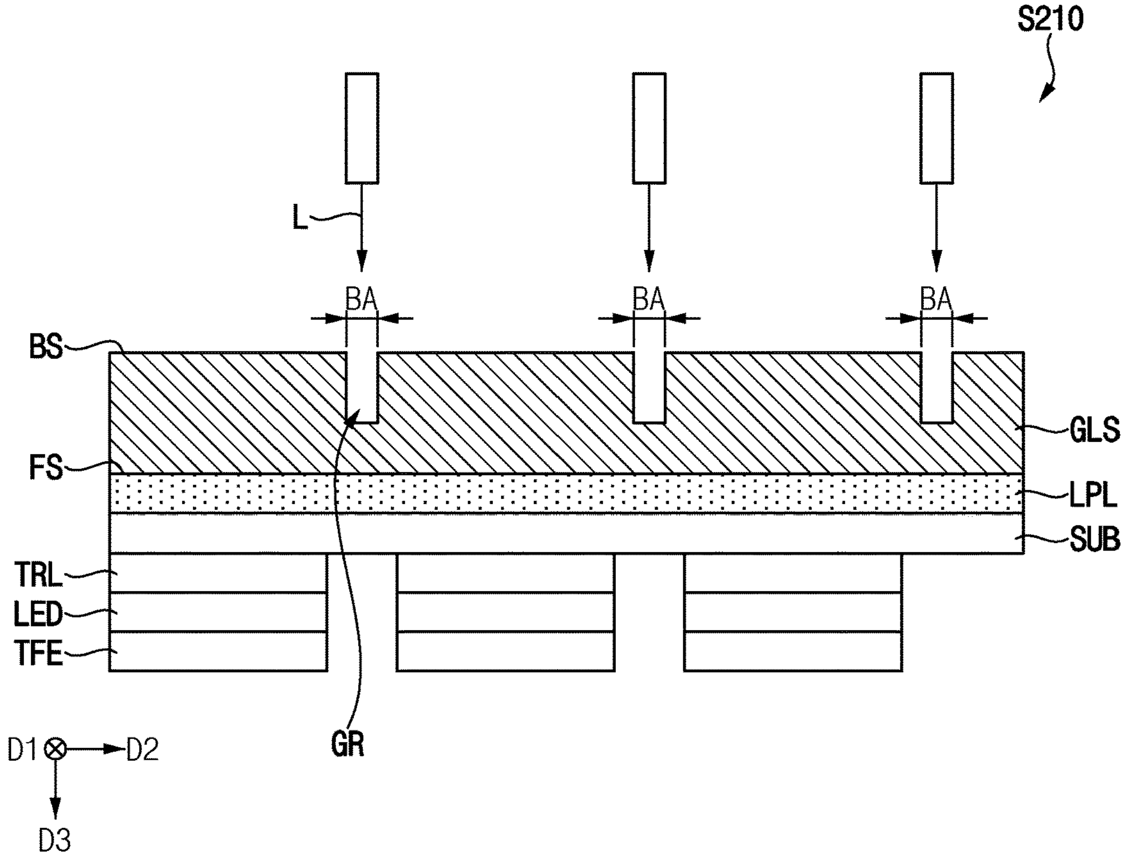

Referring to FIGS. 16 and 18, a groove GR overlapping the bending area BA may be formed by irradiating a laser L to the back surface BS of the glass GLS (S210). For example, by inducing ablation of the glass GLS using thermal energy generated by the laser L, a portion of the glass GLS may be removed so that the groove GR is formed.

Figure 19:
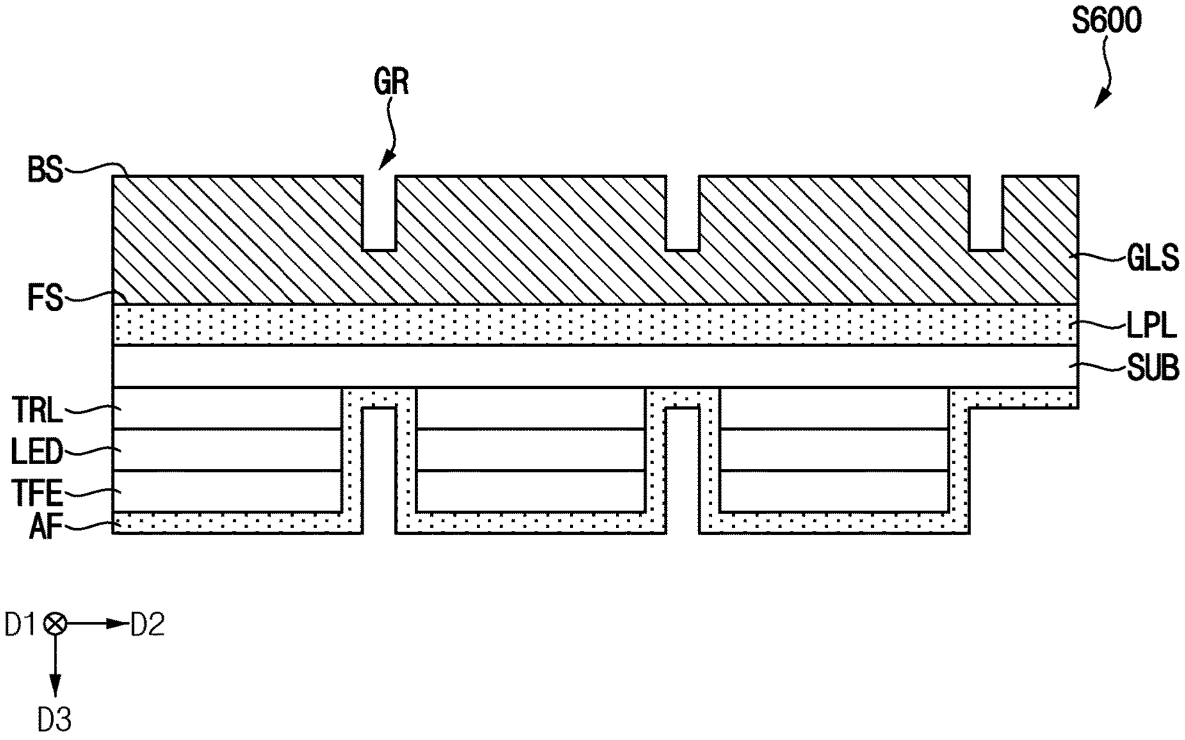

Referring to FIGS. 16 and 19, the acid-resistant film AF may be formed on the front surface FS of the glass GLS (S600). According to some embodiments, the acid-resistant film AF may be attached while covering the substrate SUB and the encapsulation layer TFE. In addition, a separate protective film may be further attached between the encapsulation layer TFE and the acid-resistant film AF. The acid-resistant film AF may protect the substrate SUB, the transistor layer TRL, the light emitting diode layer LED, and the encapsulation layer TFE from an etching solution (e.g., hydrofluoric acid solution).

Figure 20:
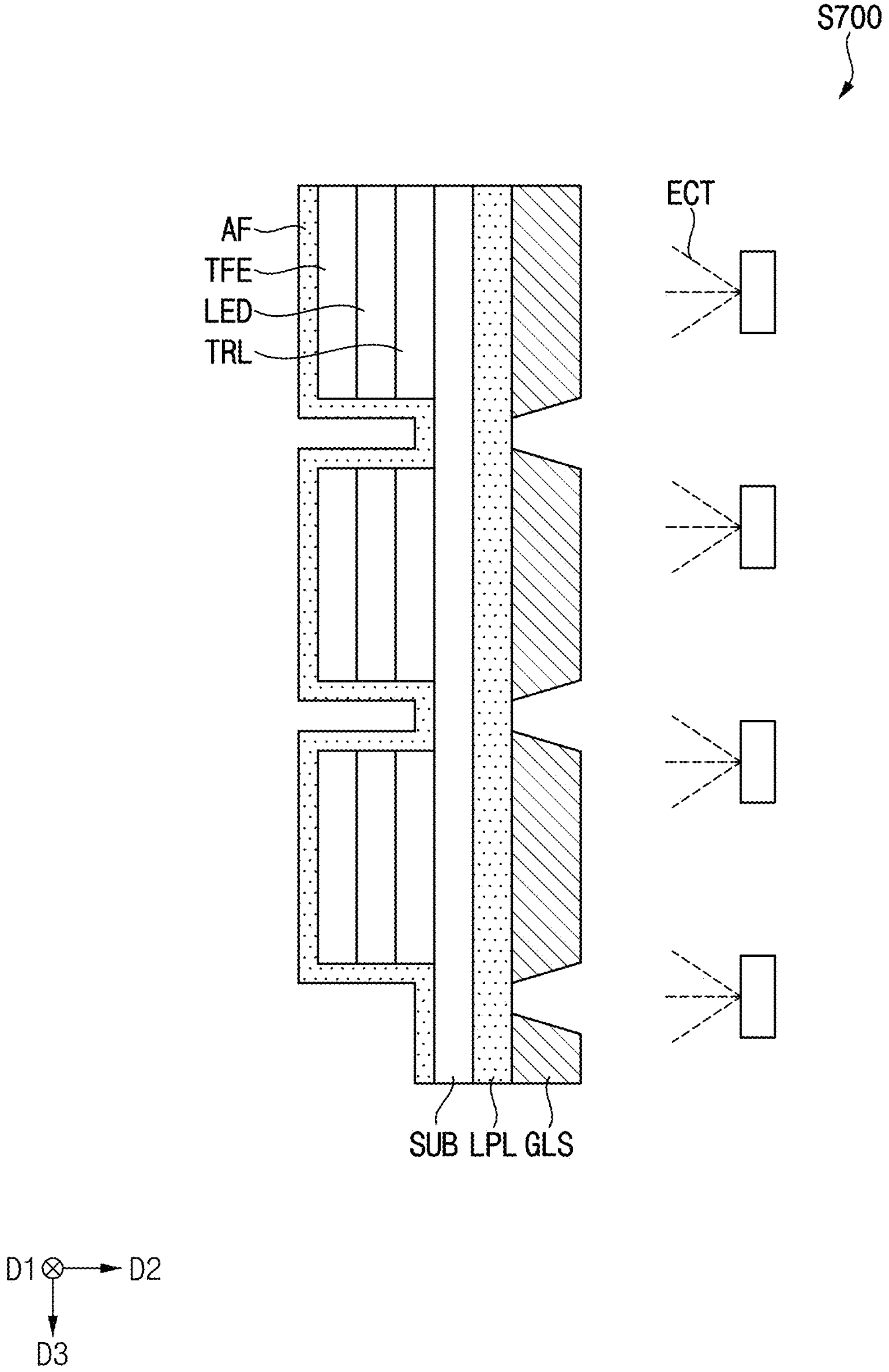

Referring to FIGS. 16 and 20, the glass GLS may be wet etched with an etching solution ECT (S700). According to some embodiments, the etching solution ECT may be a hydrofluoric acid solution, and the glass GLS may be isotropically etched by the hydrofluoric acid solution. Accordingly, the overall thickness of the glass GLS may be reduced, and the glass GLS overlapping the bending area BA where the groove GR is formed may be completely removed.

Figure 21:
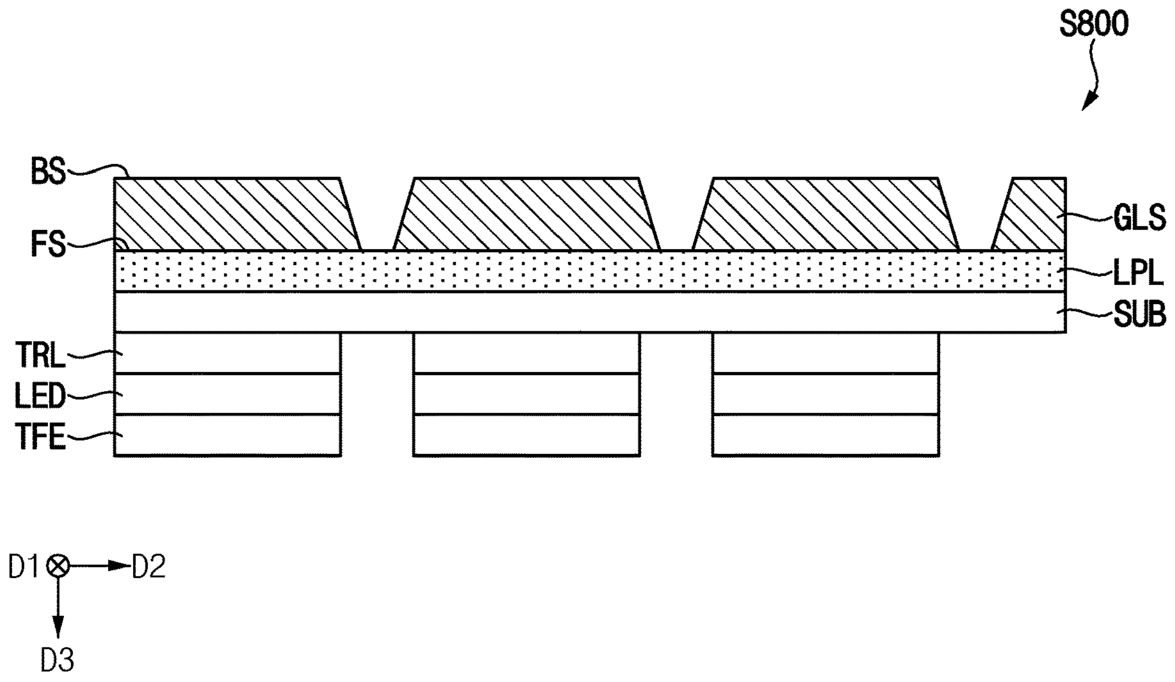

Referring to FIGS. 16 and 21, after the wet etching process is performed, the acid-resistant film AF may be removed (S800).

Figure 22:
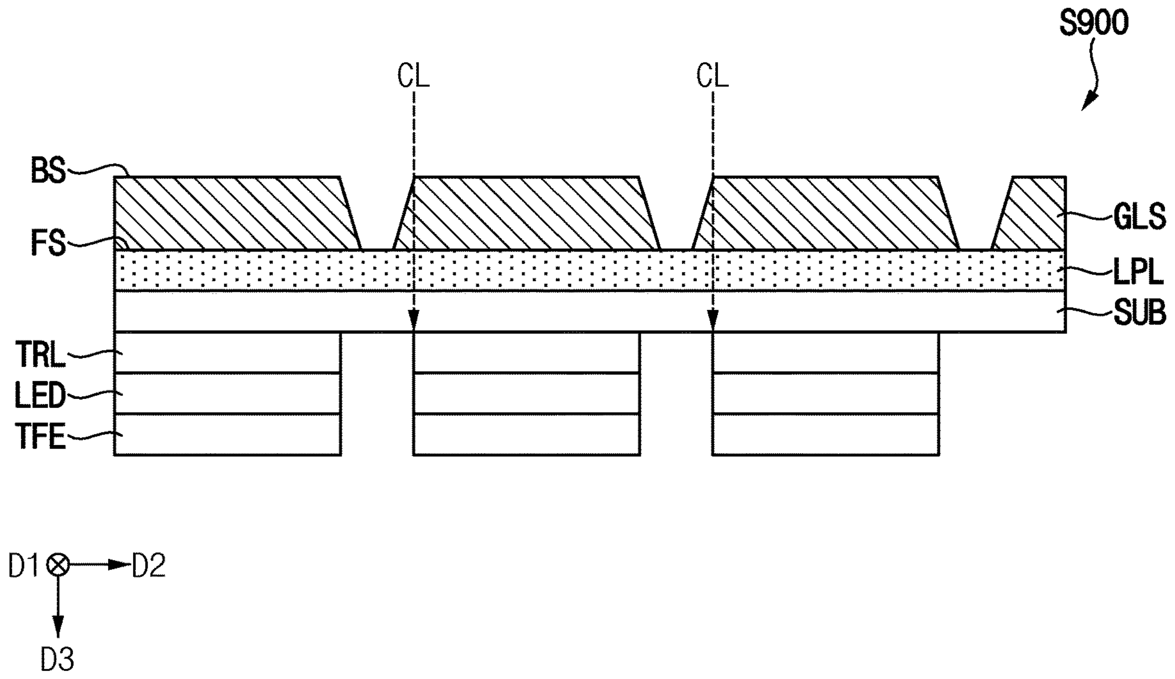

Referring to FIGS. 16 and 22, the glass GLS may be cut in cell units along the cutting line CL (S900).

In the method (S2000) of manufacturing a display device according to some embodiments of the present invention, the transistor layer TRL, the light emitting diode layer LED, and the encapsulation layer (TFE) may be formed on the glass GLS, the groove GR may be formed in the glass GLS through the laser, and the glass GLS may be etched through a wet etching process. The glass GLS may serve as a support substrate while forming the transistor layer TRL, the light emitting diode layer LED, and the encapsulation layer TFE, and may relatively improve durability of the display device 1000. In addition, as the groove GR is formed by irradiating a laser, chemical by-products may not be generated during the formation of the groove GR. Accordingly, the etching distribution of the wet etching process may be relatively improved, and the taper angle of the glass GLS may be formed to a target angle.

Although aspects of some embodiments and implementations have been described herein, other embodiments and modifications will be apparent from this description. Accordingly, embodiments according to the present disclosure are not limited to the specific disclosed embodiments, but rather to the broader scope of the appended claims, and their equivalents, and various obvious modifications and equivalent arrangements as would be apparent to a person of ordinary skill in the art.

What is claimed is:

1. A method of manufacturing a display device, the method comprising:
- forming a patterning film on a back surface of a glass, wherein the back surface of the glass is planar;
- patterning the patterning film to expose a bending area of the glass, wherein the bending area corresponds to a region configured to bend during operation of the display device;
- forming a groove overlapping the bending area into the planar back surface of the glass by providing abrasive particles to the exposed glass;
- forming an acid-resistant film on a front surface of the glass; and
- etching the glass to completely remove the glass overlapping the bending area where the groove is formed.

2. The method of claim 1, wherein the groove is formed by a blast process using the abrasive particles.

3. The method of claim 1, wherein the abrasive particles are chemically stable particles from the glass.

4. The method of claim 3, wherein each of the abrasive particles is alumina oxide ($Al_2O_3$).

5. The method of claim 3, wherein an average diameter of each of the abrasive particles is in a range of 3 micrometers (μm) to 4 μm.

6. The method of claim 1, wherein the patterning film is a dry film resist (DFR).

7. The method of claim 6, wherein a thickness of the dry film resist is in a range of 40 μm to 50 μm.

8. The method of claim 1, further comprising:
- removing the patterning film, after forming the groove.

9. The method of claim 1, wherein etching the glass comprises wet etching by a hydrofluoric acid solution.

10. The method of claim 1, further comprising:
- removing the acid-resistant film, after etching the glass.

11. The method of claim 1, further comprising:
- forming a substrate on the front surface of the glass;
- forming a transistor layer on the substrate;
- forming a light emitting diode layer on the transistor layer; and
- forming an encapsulation layer on the light emitting diode layer.

12. The method of claim 1, wherein forming the groove is performed in a first chamber, and
- etching the glass is performed in a second chamber different from the first chamber.

* * * * *